United States Patent [19]

Ahn et al.

[11] Patent Number: 5,625,585
[45] Date of Patent: *Apr. 29, 1997

[54] BIT LINE STRUCTURE WITH BIT LINE PASS OVER CONFIGURATION

[75] Inventors: Jin-Hong Ahn; Tae-Hyoung Kim, both of Kyungki-do, Rep. of Korea

[73] Assignee: Goldstar Electron Co., Ltd., Cheong-ju, Rep. of Korea

[*] Notice: The term of this patent shall not extend beyond the expiration date of Pat. No. 5,499,205.

[21] Appl. No.: 580,270

[22] Filed: Dec. 28, 1995

Related U.S. Application Data

[63] Continuation of Ser. No. 380,757, Jan. 31, 1995, Pat. No. 5,499,205.

[51] Int. Cl.$^6$ .................................................. G11C 5/06
[52] U.S. Cl. .................................. 365/63; 365/51; 365/72
[58] Field of Search ............................. 365/63, 51, 72, 365/190, 230.03, 189.09, 230.02

[56] References Cited

U.S. PATENT DOCUMENTS

| | | | |
|---|---|---|---|
| 5,060,189 | 10/1991 | Ota | 365/63 |
| 5,107,459 | 4/1992 | Chu et al. | 365/63 |
| 5,272,665 | 12/1993 | Vesugi | 365/63 |
| 5,396,450 | 3/1995 | Takashima et al. | 365/63 |
| 5,457,648 | 10/1995 | Eisig | 365/63 |
| 5,499,205 | 3/1996 | Ahn et al. | 365/63 |

OTHER PUBLICATIONS

"Twisted Bit–line Architectures for Multi–megabit DRAM's", Hideto Hidaka et al., IEEE Journal of Solid–State Circuits, vol. 24, No. 1, Feb. 1989.

*Primary Examiner*—David C. Nelms
*Assistant Examiner*—Vu A. Le
*Attorney, Agent, or Firm*—Fleshner & Kim

[57] ABSTRACT

A bit line structure is disclosed. Which includes: sense amplifiers each connected to two pairs of bit lines BL and /BL through bit line selecting switches, to the bit line a plurality of cells are connected, includes: a first bit line pair BL and /BL and a second bit line pair BL and /BL formed by dividing a bit line disposed within a same column respectively in a cell array; a first connecting bit line for connecting the bit line BL of said second bit line pair to said sense amplifier; a second connecting bit line for connecting the bit line /BL of said second bit line pair to said sense amplifier; said second connecting bit line having two crossing sections 25 crossing with another second connecting bit line for connecting a bit line BL of a second bit line belonging to an adjacent sense amplifier; and bit line selecting switches for connecting said first bit line pair and said second bit line pair respectively to said sense amplifier, whereby a number of memory cells connected to each bit line is reduced to ½ compared with the conventional technique, the bit lines are arranged 3-dimensionally to eliminate the area loss in carrying out the layout, and particularly, the connecting bit lines are made of a conductive material which has a smaller resistance than a conductive material of the bit lines.

3 Claims, 2 Drawing Sheets

BIT LINE STRUCTURE WITH BIT LINE PASS OVER CONFIGURATION

This application is a continuation of application Ser. No. 08/380,757 filed Jan. 31, 1995, U.S. Pat. No. 5,499,205.

FIELD OF THE INVENTION

The present invention relates a low power consumption type bit line structure, particularly to a bit line structure in which the chip operating current can be reduced without expanding the layout area, and the sensing noise between bit lines can be reduced.

BACKGROUND OF THE INVENTION

In a DRAM, in order to read the data (i.e., the charge stored in the capacitor) which is stored in a cell, the cell is selected by designating a word line and a bit line which are arranged in the longitudinally and laterally. Thus the information of the cell is read by being transmitted to a sense amplifier, and the information thus read out is transmitted through a data bus to the outside of the DRAM.

Recently, large scale DRAM chips have been developed, and the number of cells connected to one bit line has been increased. Further, the unit area of the cell has been reduced, and the gaps between word lines and bit lines have been narrowed, with the result that the power consumption has been increased, and that the sensing noise has also been increased, thereby aggravating the reliability of DRAM cell.

In order to describe the conventional technique for the bit line structure, a simple circuit is illustrated in FIG. 1.

Cell arrays AR0, AR1, AR2, . . . respectively include a plurality word lines WL1, WL2, . . . WLi . . . and bit lines BL and /BL. The bit lines are made of a conductive material such as polysilicon or a metal. Each of the bit lines is connected to a bit line selecting switch 12. The bit line selecting switch 12 is disposed between the cell arrays AR0 and AR1, and is connected to the sense amplifier.

A pair of the bit line selecting switch 12 to which the bit lines BL and /BL are connected are connected to a sense amplifier, and two pairs of the bit lines BL and are /BL respectively connected to the upper side and the lower side of the sense amplifier. That is, four of the bit line switches are connected in such a manner that four bit lines are connected to each of the sense amplifiers.

In the illustrated structure, the sense amplifier is a shared sense amplifier which is shared by two pairs of the bit lines which are included in the cell arrays AR0 and AR1.

A pair of the bit lines (bit line and /bit line, hereinafter "/" means "Bar") connected to the sense amplifier belongs to one cell array, and the other pair of the bit line (bit line and/bit line) belongs to another cell array.

The operation of the conventional technique as illustrated in FIG. 1 will be described as to its operations.

In order to select a cell CLi which belong to the cell array AR0, if a word line WLi is selected, then the information which is stored in the cell CLi is loaded on the bit line.

Under this condition, all the data of the cells which are connected to the same word line are loaded on the respective bit lines.

The sense amplifier SAi reads the data by comparing and amplifying the voltages of the bit lines BL and /BL through the bit line selecting switches.

Thus a bit line BLi is selected, and the information of the cell CLi is read out.

In this way, if the information which is stored in the cell is loaded on a bit line of the sense amplifier, the information is amplified to be stored into the capacitor again. Then the word line is deactivated, and the sense amplifier and the bit lines are restored to the original status.

In the above described conventional technique, when the layout is made within the limited area, the number of memory cells connected to a bit line is very large, while the capacitance of the bit line is enlarged. Therefore, when the chip is operated, the current flowing through the bit line is increased. Further, the increase of the capacitance between bit lines may cause errors during the reading.

SUMMARY OF THE INVENTION

The present invention is intended to overcome the above described disadvantages of the conventional technique.

Therefore it is the object of the present invention to provide low consumption type bit line structure, in which the chip operating current can be reduced without expanding the layout area, and the sensing noise between bit lines can be reduced compared with the conventional method.

In achieving the above object, a bit line structure having sense amplifiers each connected to two pairs of bit lines BL and /BL through bit line selecting switches, to the bit line a plurality of cells are connected, includes: a first bit line pair BL and /BL and a second bit line pair BL and /BL formed by dividing a bit line disposed within a same line respectively in a cell array; a first connecting bit line for connecting the bit line BL of said second bit line pair to said sense amplifier; a second connecting bit line for connecting the bit line /BL of said second bit line pair to said sense amplifier; said second connecting bit line having two crossing sections crossing with another second connecting bit line for connecting a bit line BL of a second bit line belonging to an adjacent sense amplifier; and bit line selecting switches for connecting said first bit line pair and said second bit line pair respectively to said sense amplifier, whereby a number of memory cells connected to each bit line is reduced to ½ compared with the conventional technique, the bit lines are arranged 3-dimensionally to eliminate the area loss in carrying out the layout, and particularly, the connecting bit lines are made of a conductive material which has a smaller resistance than a conductive material of the bit lines.

The second connecting bit line passes over the first bit line of the bit line BL of another sense amplifier, and, among the two crossing points, one of them is located between the sense amplifier and the bit line selecting switch. The first and second connecting bit lines are composed of a material different from that of the first and second bit lines.

The present invention also provides a semiconductor memory device having the above described bit line structure.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
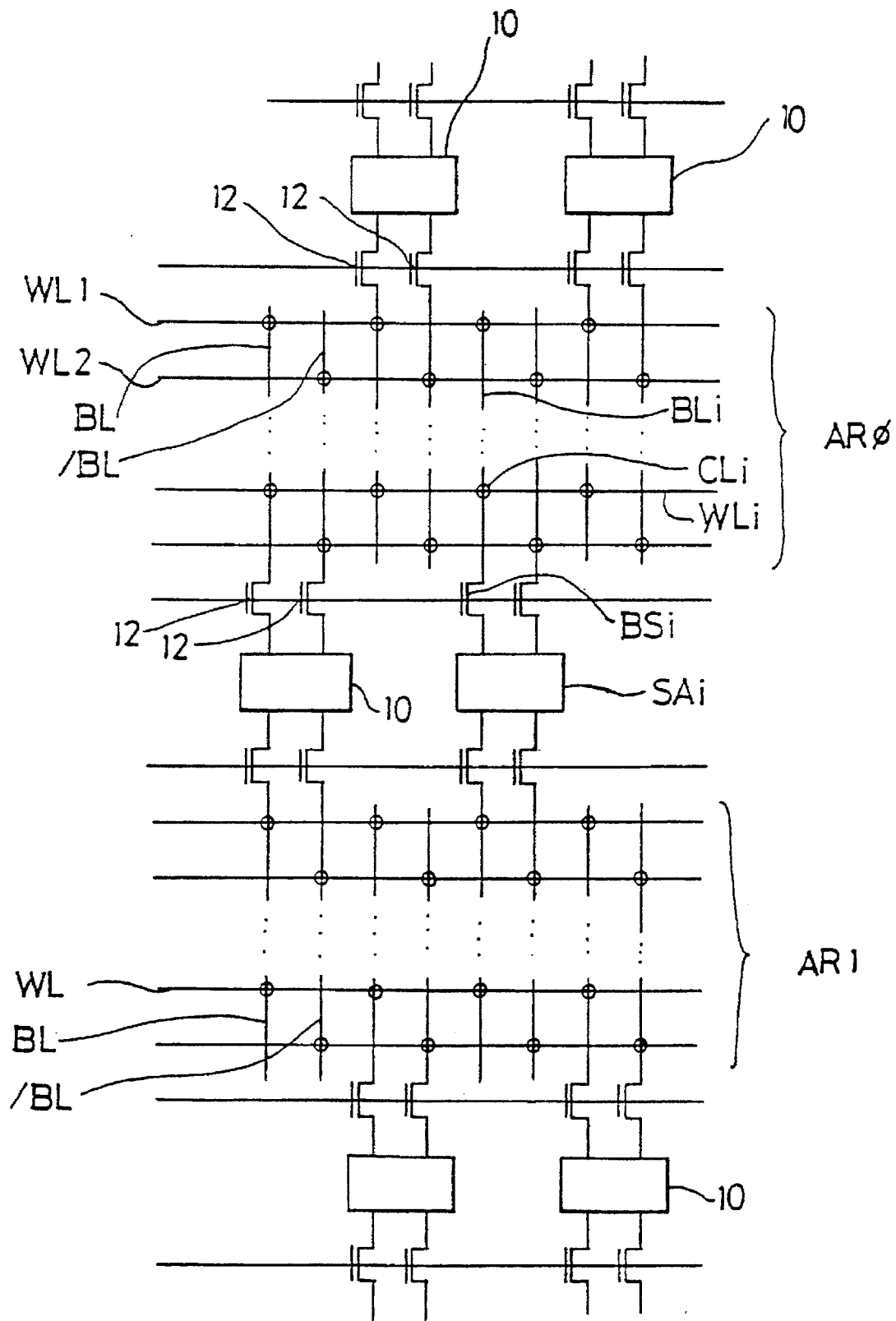
FIG. 1 is a circuital illustration showing the conventional bit line structure.
Figure 2:
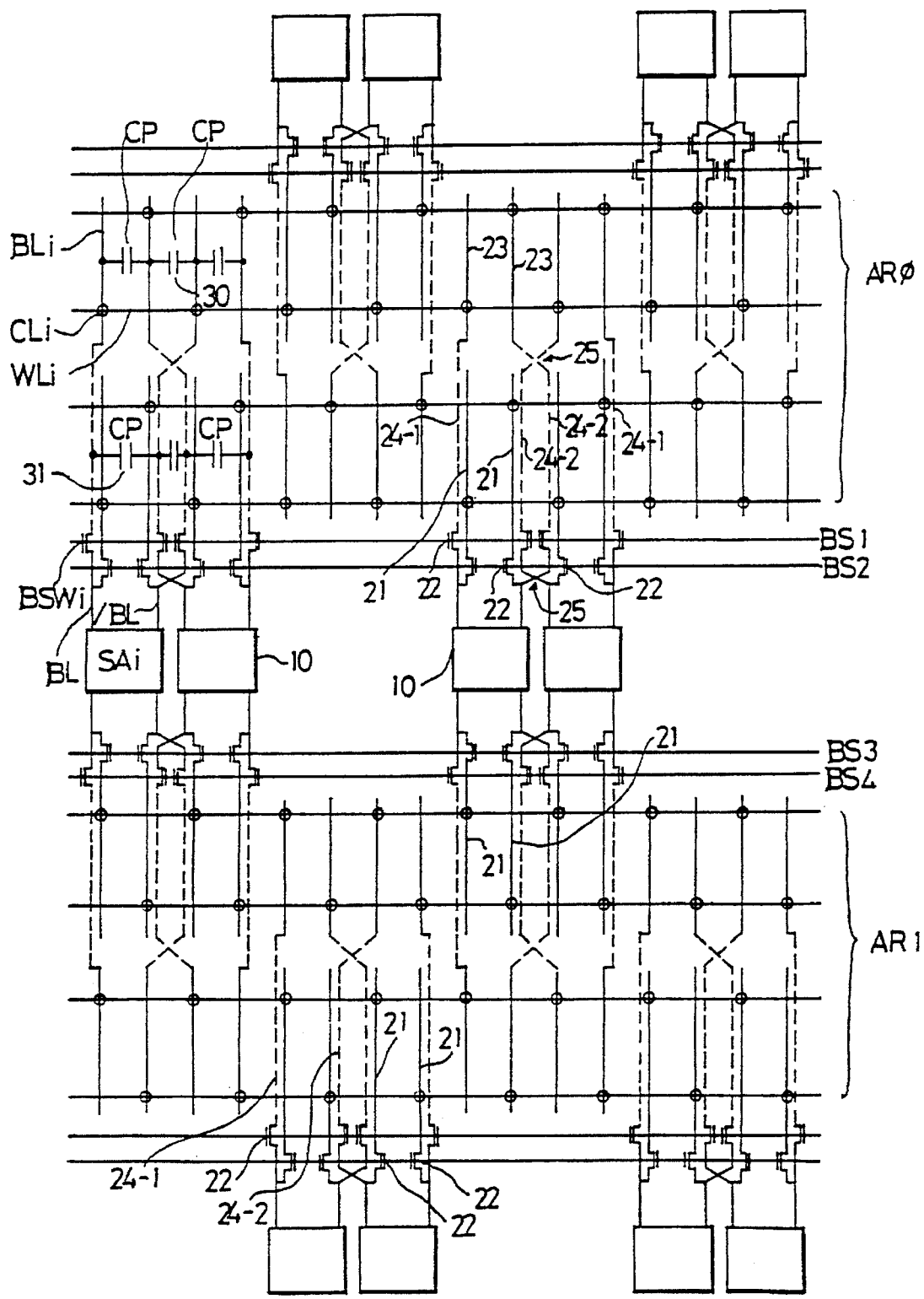
FIG. 2 is a circuital illustration showing the low power consumption type bit line structure according to the present invention.

A bit line selecting switch is connected to each bit line to which a plurality of cells are connected, so that the relevant bit line can be connected to a sense amplifier.

A sense amplifier is disposed between a cell array AR0 and a cell array AR1, and four bit line pairs, i.e., four bit lines BL and four bit lines /BL ("/" means Bar) are connected through respective selecting switches to the sense amplifier.

Each of the cell arrays includes bit lines BL and /BL alternately continuously. The bit lines BL and are distinguished from each other connected to the same sense amplifier, and form a pair together. Within a cell array, the number of the sense amplifier is same as the number of the pairs of the bit lines.

The bit lines BL and /BL are formed in parallel in pairs. The length of the bit line BL is equivalent to one half of the bit line of the conventional technique, and the bit line BL is divided into two at the middle, while it is composed of one material (a first bit line material).

Among the two BL and the two /BL, a first bit line 21 which is disposed nearer to the sense amplifier is connected directly through a bit line selecting switch 22 to the sense amplifier.

Among the two BL and the two /BL, a second bit line 23 (e.g., the bit line BL as one of the second bit lines BL and /BL) which is remotely separated from the sense amplifier is connected to a first connecting bit line 24-1 which is composed of a second bit line material and which is formed as another layer. This first connecting bit line is connected through a bit line selecting switch 22 to the sense amplifier.

Another (e.g., /BL of the second bit lines BL and /BL) of the second bit lines 23 is connected through the bit line selecting switch 22 and a second connecting bit line 24-2 (which is composed of the second bit line material and is formed as another layer different from the first bit line) to the sense amplifier. This second connecting bit line 24-2 of BL passes over the first bit line of BL of another sense amplifier. Further, this second connecting bit line has two crossing points crossing with another second connecting bit line 24-2 which connects the second bit line of BL of another sense amplifier.

One of the two crossing points 25 is positioned between the sense amplifier 10 and the bit line selecting switch 22.

The connecting bit line 24 may be composed of the first bit line material, and more preferably composed of the second bit line material which has a better conductivity compared with the first bit line material.

The crossing section 25 makes the bit lines crossed at a point where the first bit line material and the second bit line material meet together.

Such a bit line structure is connected to the sense amplifier to the upper side and the lower side in a symmetrical manner.

The bit line is divided into two so that the number of the memory cells would be reduced into ½ compared with the conventional technique in which only one bit line material is used. Further, a 3-dimensional wiring is done in two layers, so that the no loss would occur to the layout area. Particularly, one of the materials is made to be 3-dimensionally crossed at the portion where the two bit line materials are connected together, so that it would be strong against the noise during the sensing.

Two connecting bit lines cross each other per four bit lines, and these four bit lines run in the same direction so as to be connected to the sense amplifier which belongs to the same cell array.

The structure of the present invention constituted as above will now be described as to its operations.

For example, in order to select a cell CLi belonging to the cell array AR0 (i indicates an arbitrary number, but in the drawing, it indicates a particular portion for facilitate the understanding. i should be understood throughout the specification in this way), if a word line WLi is selected, the information stored in the selected cell CLi is loaded to the bit line. Under this condition, all the data of all the cells connected to the word line is loaded on the bit line.

Then the sense amplifier reads the information by comparing and amplifying the voltages of the bit lines BL and /BL through the bit line selecting switch BSWi which has been turned on by a bit line selecting signal BS1.

Then the bit line BLi is selected to read the information stored in the cells CLi.

Thus when the information stored in the cell is loaded on the bit line of the sense amplifier, it is amplified to be restored into the capacitor of the cell. Then the word line is closed, and the sense amplifier and the respective bit lines are restored to the original state.

The operation up to now is same as the conventional technique, but the present invention is different in that the present invention uses four bit line selecting signals BS1, BS2, BS3 and BS4, whereas the conventional technique used only two bit line selecting signals.

When sensing the information of a selected cell, a coupling influence is given to between the bit lines BL and /BL by a parasitic capacitor Cp. This influence brings the result that the potential of the bit line becomes different in accordance with 0 or 1 of the adjacent cells, thereby causing noise during the sensing. In the present invention, owing to the crossing portions (the second connecting bit line portions), the bit line BL and the bit line /BL receive the same noise, with the result that the noise is offset.

To describe it in more detail, when sensing the information of a selected cell, the bit line /BL receives a noise from a parasitic capacitor (Cp) 30 which is formed with another adjacent bit line BL. At the same time, the bit line BL also receives a noise from another parasitic capacitor (Cp) 31 which is formed with another BL of an adjacent sense amplifier. Consequently, the noises are offset with each other so to reduce the noise.

According to the present invention, the number of the memory cells per bit line is reduced into one half compared with the conventional technique, and the bit lines are wired in a 3-dimensional form so as to eliminate the layout loss. Particularly, one bit line material is 3-dimensionally crossed at the portion where two bit line materials are connected together, so that the structure would strong against the noise during the sensing.

What is claimed is:

1. A bit line structure having sense amplifiers, each sense amplifier being connected to two pairs of bit lines BL and /BL through bit line selecting switches, and each bit line being connected to a plurality of cells, comprising:

a first bit line pair BL and /BL and a second bit line pair BL and /BL formed by dividing a bit line disposed within a same column respectively in a cell array;

a first connecting bit line for connecting the bit line BL of said second bit line pair to said sense amplifier;

a second connecting bit line for connecting the bit line /BL of said second bit line pair to said sense amplifier; and bit line selecting switches for connecting said first bit line pair and said second bit line pair respectively to said sense amplifier, wherein the first connecting bit line and the second connecting bit line pass over the first bit lines.

2. The bit line structure as claimed in claim 1, wherein said first and second connecting bit lines are composed of a material different from that of said first and second bit lines.

3. A semiconductor memory device having a bit line structure of any one of claims 2 and 1.

* * * * *